(12) United States Patent
    Tai et al.

(10) Patent No.:    US 12,687,753 B2
(45) Date of Patent:         Jul. 21, 2026

(54) ELECTRONIC DEVICE

(71) Applicant: InnoLux Corporation, Miao-Li County (TW)

(72) Inventors: Ming-Jou Tai, Miao-Li County (TW); Chia-Hao Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 356 days.

(21) Appl. No.: 18/409,804

(22) Filed: Jan. 11, 2024

(65) Prior Publication Data

US 2024/0280866 A1        Aug. 22, 2024

(30) Foreign Application Priority Data

Feb. 16, 2023    (CN) .......................... 202310123233.X

(51) Int. Cl.
| | |
|---|---|
| *H10D 86/60* | (2025.01) |
| *G02F 1/1362* | (2006.01) |
| *G02F 1/1368* | (2006.01) |
| *H10D 86/40* | (2025.01) |

(52) U.S. Cl.
CPC .. *G02F 1/136213* (2013.01); *G02F 1/136209* (2013.01); *G02F 1/136286* (2013.01); *G02F 1/1368* (2013.01); *H10D 86/443* (2025.01); *H10D 86/60* (2025.01)

(58) Field of Classification Search
CPC . H10D 30/6729; H10D 86/441; H10D 86/451
See application file for complete search history.

(56) References Cited

U.S. PATENT DOCUMENTS

| | | | |
|---|---|---|---|
| 2015/0346528 A1 | 12/2015 | Ge | |
| 2017/0017327 A1* | 1/2017 | Chang ................. | G06F 3/04164 |
| 2022/0326581 A1* | 10/2022 | Kimura ............. | G02F 1/134363 |
| 2024/0210775 A1* | 6/2024 | Tai ......................... | H10D 86/60 |
| 2024/0260334 A1* | 8/2024 | Tai ..................... | H10K 59/8792 |

FOREIGN PATENT DOCUMENTS

| | | |
|---|---|---|
| CN | 106444198 A | 2/2017 |
| WO | 2021/171714 A1 | 9/2021 |

* cited by examiner

*Primary Examiner* — Fazli Erdem
(74) *Attorney, Agent, or Firm* — Winston Hsu

(57)        ABSTRACT

An electronic device including a substrate, a thin film transistor, a first organic layer, a first conductive layer, a second organic layer, a second conductive layer and a third conductive layer is disclosed. The thin film transistor is disposed on the substrate. The first organic layer is disposed on the thin film transistor and has a hole. The first conductive layer is disposed on the first organic layer, and the first conductive layer is electrically connected to the thin film transistor through the hole. The second organic layer is disposed on the first organic layer and the first conductive layer, and at least partially disposed in the hole. The second conductive layer is disposed on the second organic layer and electrically connected to the first conductive layer. The third conductive layer is disposed between the second organic layer and the second conductive layer.

18 Claims, 12 Drawing Sheets

SC
V2
V1
GR
DE(M2)
M3
GL(M1)
V3
LS
DL(M2)

150
(PE)

V5

130
(PE)

DE
(M2)

V4
V3

GL
(M1)

M3

140

A

A'

DL(M2)

Y

Z

X

150(PE)
130(PE)
V5
OP
DE(M2)
GL(M1)
V3
V4
DL(M2)
160(CE)

ELECTRONIC DEVICE

BACKGROUND OF THE DISCLOSURE

1. Field of the Disclosure

The present disclosure relates to an electronic device.

2. Description of the Prior Art

In electronic devices such as virtual reality (VR) devices and liquid crystal display devices, products that having pixels with a small size may cause the storage capacitance of the pixels extremely small, resulting in poor display quality of devices.

SUMMARY OF THE DISCLOSURE

One of objectives of the present disclosure is to provide an electronic device, so as to solve the problems encountered by the conventional electronic devices. According to the structural design of conductive layers and organic layers of the present disclosure, the storage capacitance may be increased, the voltage uniformity of the electrode may be improved, and/or the light-shielding function may be provided, thereby improving the display quality of the electronic device.

An embodiment of the present disclosure provides an electronic device. The electronic device includes a substrate, a thin film transistor, a first organic layer, a first conductive layer, a second organic layer, a second conductive layer and a third conductive layer. The thin film transistor is disposed on the substrate. The first organic layer is disposed on the thin film transistor and has a hole. The first conductive layer is disposed on the first organic layer, and the first conductive layer is electrically connected to the thin film transistor through the hole. The second organic layer is disposed on the first organic layer and the first conductive layer and at least partially disposed in the hole. The second conductive layer is disposed on the second organic layer and electrically connected to the first conductive layer. The third conductive layer is disposed between the second organic layer and the second conductive layer.

An embodiment of the present disclosure provides an electronic device. The electronic device includes a substrate, a thin film transistor, a first organic layer, a first conductive layer, a second organic layer, a second conductive layer and a third conductive layer. The thin film transistor is disposed on the substrate and includes a drain. The first organic layer is disposed on the thin film transistor and has a hole. The first conductive layer is disposed on the first organic layer. The second organic layer is disposed on the first organic layer and the first conductive layer and at least partially disposed in the hole. The second conductive layer is disposed on the second organic layer and electrically connected to the first conductive layer. The third conductive layer is disposed between the second organic layer and the second conductive layer and electrically connected to the drain.

These and other objectives of the present disclosure will no doubt become obvious to those of ordinary skill in the art after reading the following detailed description of the embodiment that is illustrated in the various figures and drawings.

DETAILED DESCRIPTION

Figure 1A:
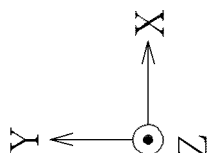
FIG. 1A is a partial top-view schematic diagram of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations, components and/or combinations thereof.

When an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented.

The electrical connection or coupling described in the present disclosure may refer to direct connection or indirect connection. In the case of direct connection, the terminals of two components in a circuit are directly connected or connected with each other through a conductor segment, while in the case of indirect connection, there are switches, diodes, capacitors, inductors, resistors, other suitable components or combinations of the above components between the terminals of two components in a circuit, but not limited herein.

The directional terms mentioned in this document, such as "up", "down", "front", "back", "left", "right", etc., are only directions referring to the drawings. Therefore, the directional terms used are for illustration, not for limitation of the present disclosure.

The terms "equal", "identical" or "the same", and "substantially" or "approximately" generally mean being within 20% of a given value or range, or being within 10%, 5%, 3%, 2%, 1% or 0.5% of a given value or range.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

The electronic device of the present disclosure may be applied to a display device, a virtual reality device, an augmented reality device, a light-emitting device, an antenna device, a sensing device or a tiled device, but not limited herein. The electronic device may include a bendable or flexible electronic device. The display device may include a non-self-emissive display device or a self-emissive display device. The antenna device may include a liquid-crystal type antenna device or an antenna device other than liquid-crystal type, and the sensing device may include a sensing device used for sensing capacitance, light, heat or ultrasonic waves, but not limited herein. The electronic device may include electronic elements such as passive elements and active elements, for example, capacitors, resistors, inductors, diodes, transistors, etc. The diode may include a light-emitting diode or a photodiode. For example, the light-emitting diode may include an organic light-emitting diode (OLED), a mini light-emitting diode (mini LED), a micro light-emitting diode (micro LED) or a quantum dot light-emitting diode (quantum dot LED), but not limited herein. The tiled device may be, for example, a display tiled device or an antenna tiled device, but not limited herein. It should be noted that the electronic device may be any arrangement and combination of the above, but not limited herein. In addition, the appearance of the electronic device may be a rectangle, a circle, a polygon, a shape with curved edges or other suitable shapes. The electronic device may have a peripheral system such as a driving system, a control system, a light source system, etc., to support a display device, an antenna device, a wearable device (including an augmented reality device or virtual reality device, for example), a vehicle-mounted device (including an automobile windshield, for example) or a tiled device.

It should be noted that the technical features in different embodiments described in the following can be replaced, recombined, or mixed with one another to constitute another embodiment without departing from the spirit of the present disclosure.

Figure 1B:
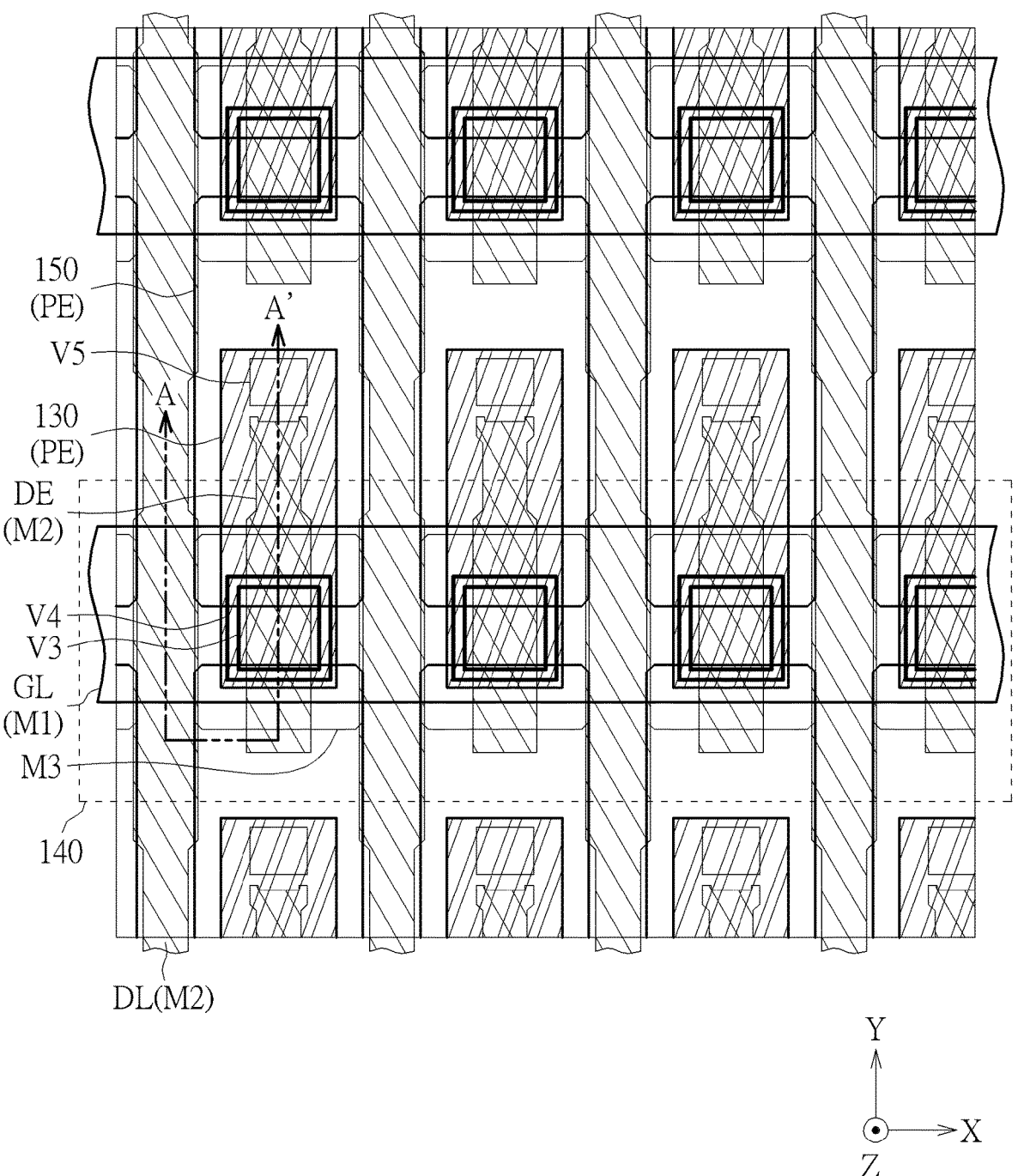
FIG. 1B is another partial top-view schematic diagram of an electronic device according to a first embodiment of the present disclosure.
Figure 2:
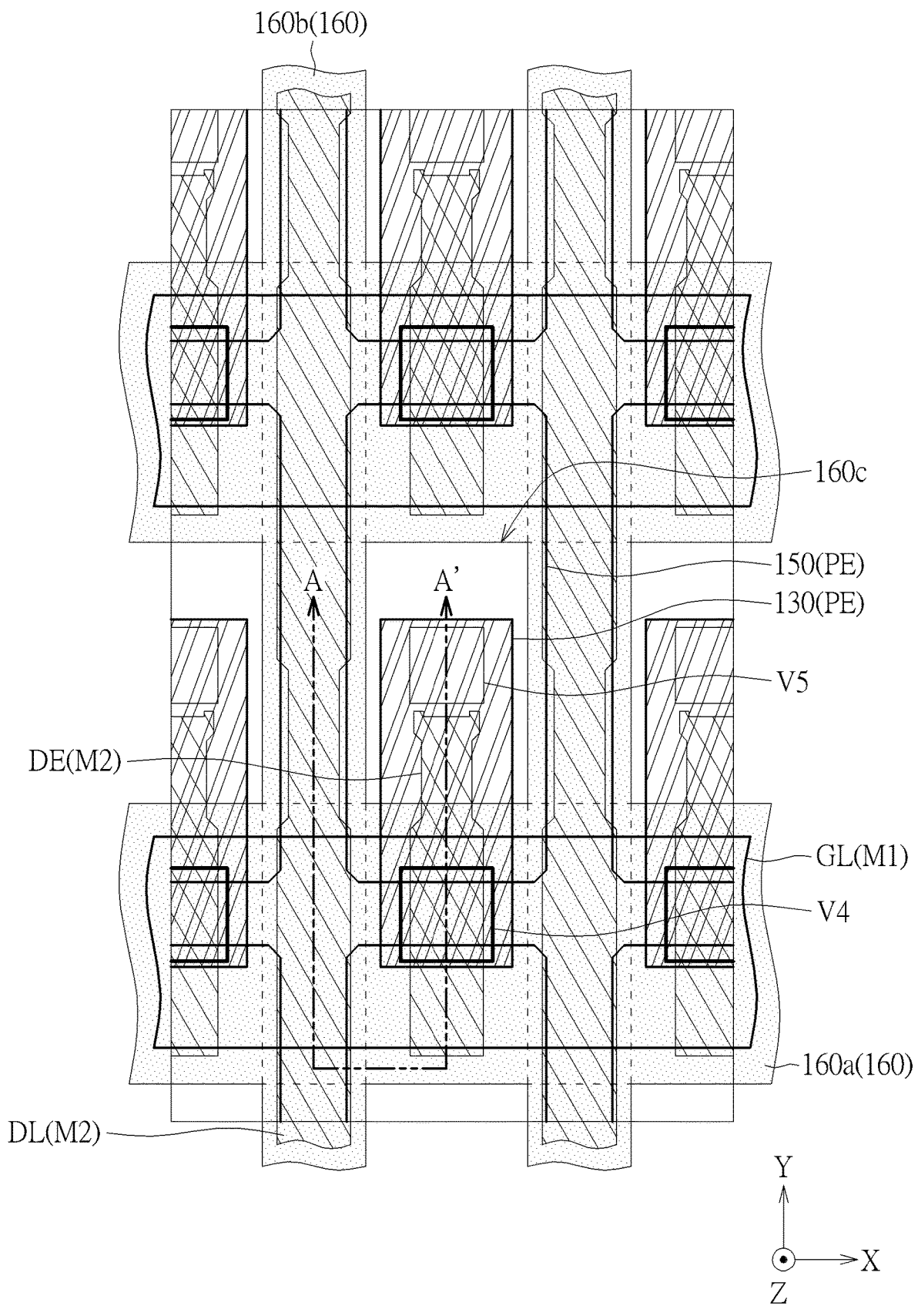
FIG. 2 is still another partial top-view schematic diagram of an electronic device according to a first embodiment of the present disclosure.
Figure 3:
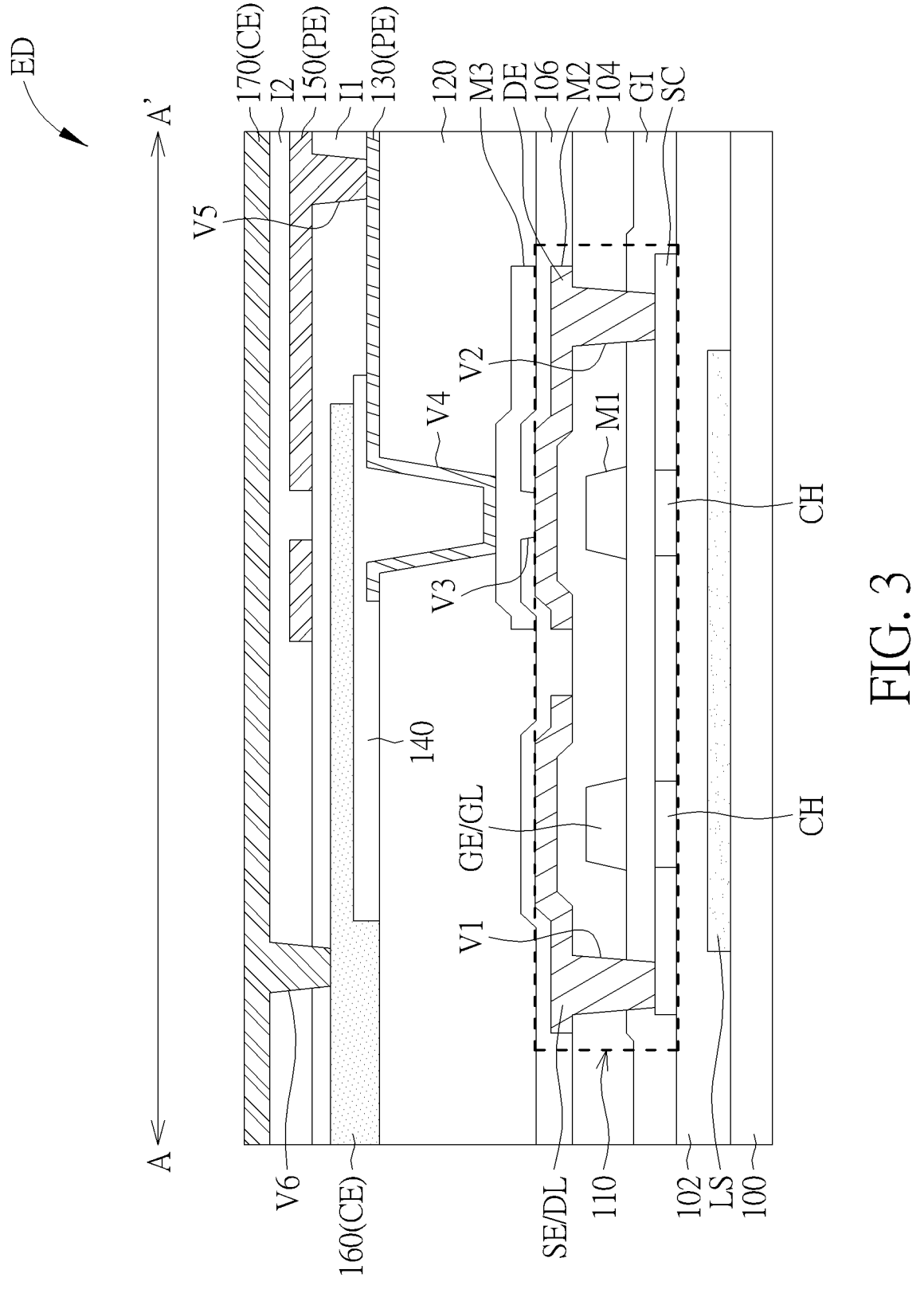
FIG. 3 is a partial cross-sectional schematic diagram of an electronic device according to a first embodiment of the present disclosure.

Please refer to FIG. 1A, FIG. 1B, FIG. 2 and FIG. 3. FIG. 1A is a partial top-view schematic diagram of an electronic device according to a first embodiment of the present disclosure. FIG. 1B is another partial top-view schematic diagram of an electronic device according to a first embodiment of the present disclosure. FIG. 2 is still another partial top-view schematic diagram of an electronic device according to a first embodiment of the present disclosure. FIG. 3 is a partial cross-sectional schematic diagram of an electronic device according to a first embodiment of the present disclosure. FIG. 1A, FIG. 1B and FIG. 2 respectively show the top views of only a portion of elements of an electronic device ED shown in FIG. 3, wherein FIG. 1A and FIG. 1B are top-view schematic diagrams substantially corresponding to the same region of the electronic device ED. For the conciseness of the drawings and/or clarity for showing the relative arrangement of elements, different elements and layers in the region are labeled and shown by several top-view schematic diagrams respectively. The partial cross-sectional structure of the electronic device ED corresponding to the section line A-A' in FIG. 1A, FIG. 1B and FIG. 2 may be referred to FIG. 3. According to the embodiment shown in FIG. 1A, FIG. 1B, FIG. 2 and FIG. 3, the electronic device ED includes a substrate 100, a thin film transistor 110, a first organic layer 120, a conductive layer 130 (referred to as a first conductive layer in this embodiment), a second organic layer 140, a conductive layer 150 (referred to as a second conductive layer) and a conductive layer 160 (referred to as a third conductive layer). The thin film transistor 110 is disposed on the substrate 100, wherein the thin film transistor 110 may be used, for example (but not limited to), as a driving element or a switching element of a pixel. The thin film transistor 110 may include a drain DE, a source SE, a gate GE and a semiconductor layer SC, and an insulating layer GI is provided between the gate GE and the semiconductor layer SC, which may serve as a gate dielectric layer in the thin film transistor 110. The electronic device ED may include a scan line GL and a data line DL disposed on the substrate 100. The scan line GL may extend along a direction X, and the data line DL may extend along a direction Y, wherein the direction X is not parallel to the direction Y. For example, the direction X may be perpendicular to the direction Y, but not limited herein. The gate GE of the thin film transistor 110 may be a portion of the scan line GL, and the source SE of the thin film transistor 110 may be a portion of the data line DL.

As shown in FIG. 1A and FIG. 3, the electronic device ED may, for example, include a light-shielding layer LS, an insulating layer 102, the patterned semiconductor layer SC, the insulating layer GI, a conductive layer M1 that is patterned, an insulating layer 104 and a conductive layer M2 that is patterned, which are disposed on the substrate 100 along a direction Z in sequence. The direction Z may be a normal direction of the electronic device ED, that is, opposite to a top-view direction of the electronic device ED, and the direction X and the direction Y may be perpendicular to the direction Z respectively, but not limited herein. The material of the substrate 100 includes, for example, glass, quartz, sapphire, ceramics, polyimide (PI), polycarbonate (PC), polyethylene terephthalate (PET), other suitable materials or combinations of the above materials. The light-shielding layer LS may include, for example, metal material, black photoresist material or other materials with better light absorption. The pattern of the light-shielding layer LS may at least partially correspond to the scan line GL. For example, the light-shielding layer LS may be at least partially overlapped with the scan line GL in the direction Z, and in the direction Y, a width of the light-shielding layer LS may be greater than a width of the scan line GL, but not limited herein. The patterned conductive layer M1 may form the gate GE and the scan line GL. The patterned conductive layer M2 may form the source SE, the data line DL and the drain DE, wherein the source SE and the drain DE may be electrically connected to the semiconductor layer SC through a hole V1 and a hole V2 in the insulating layer 104 and the insulating layer GI, respectively. In some embodiments, for example, the hole V1 and the hole V2 may be formed by forming a groove GR extending along the direction X as shown in FIG. 1A in the insulating layer 104 and the insulating layer GI, but the present disclosure is not limited to the above. For example, the hole V1 and the hole V2 may be formed by forming a plurality of holes separated from each other in the insulating layer 104 and the insulating layer GI in other embodiments. In some embodiments, the electronic device ED may optionally include an insulating layer 106 and a conductive layer M3 that is patterned, and the insulating layer 106 is disposed on the conductive layer M2 and has a hole V3. The patterned conductive layer M3 is disposed on the insulating layer 106, the pattern of the conductive layer M3 may correspond to the drain DE, and the conductive layer M3 may be electrically connected to the drain DE through the hole V3. The electronic transmission performance of the drain DE may be improved by disposing the conductive layer M3, but the present disclosure is not limited to the above. For example, the insulating layer 106 and the conductive layer M3 may not be included in other embodiments. The semiconductor layer SC may include a channel region CH. The gate GE is disposed above the semiconductor layer SC and overlapped with the channel region CH. The material of the semiconductor layer SC includes, for example, amorphous silicon, polysilicon, metal oxide or combinations of the above, but not limited herein. The metal oxide includes, for example, indium-gallium-zinc oxide (IGZO), but not limited herein.

As shown in FIG. 1B and FIG. 3, the first organic layer 120 is disposed on the thin film transistor 110 and has a hole V4, and the conductive layer 130 is disposed on the first organic layer 120, wherein the conductive layer 130 is electrically connected to the thin film transistor 110 through the hole V4. The hole V4 may be completely overlapped, partially overlapped or not overlapped with the hole V3 in the direction Z. The conductive layer 130 that is patterned may be electrically connected to the drain DE of the thin film transistor 110. For example, a portion of the conductive layer 130 may be disposed in the hole V4 to contact the conductive layer M3 and be electrically connected with the conductive layer M3, and the conductive layer M3 may be electrically connected to the drain DE through the hole V3 in the insulating layer 106, so that the conductive layer 130 may be electrically connected to the drain DE, but not limited herein. The second organic layer 140 is disposed on the first organic layer 120 and the conductive layer 130 and at least partially disposed in the hole V4, and the conductive layer 150 is disposed on the second organic layer 140 and electrically connected to the conductive layer 130. Specifically, the second organic layer 140 may cover a portion of the conductive layer 130, so that the portion of the conductive layer 130 may be disposed between the first organic layer 120 and the second organic layer 140, wherein the pattern of the second organic layer 140 may, for example (but not limited to), at least partially correspond to the scan line GL. In the direction Z, the second organic layer 140 may be overlapped with the scan line GL, but not overlapped with the hole V1 and the hole V2. The conductive layer 130 and the second organic layer 140 may be partially disposed in the hole V4, and the hole V4 may be filled with the second organic layer 140. In addition, In addition, another portion of the conductive layer 130 may not be covered by the second organic layer 140, and an insulating layer I1 may be disposed between the conductive layer 130 and the conductive layer 150. The conductive layer 150 may be filled in a hole V5 in the insulating layer I1 and be electrically connected with and directly contact the exposed portion of the conductive layer 130 that is not covered by the second organic layer 140. Therefore, the conductive layer 130 and the conductive layer 150 may have the same potential and serve as a pixel electrode PE. The conductive layer 130 and the conductive layer 150 may include a transparent conductive material respectively, such as (but not limited to) indium tin oxide (ITO). The first organic layer 120 and the second organic layer 140 may include, for example, organic insulating materials, such as poly(methyl methacrylate) (PMMA), epoxy, acrylic-based resin, silicone, polyimide polymer and the combinations of the above, but not limited herein.

As shown in FIG. 2 and FIG. 3, the conductive layer 160 is disposed between the second organic layer 140 and the conductive layer 150. The conductive layer 160 may be a patterned conductive layer and disposed on the second organic layer 140, and the second organic layer 140 is disposed between the conductive layer 130 and the conductive layer 160, so that a storage capacitance may be formed between the conductive layer 130 and the conductive layer 160. The insulating layer I1 may be disposed on the conductive layer 160, and the insulating layer I1 may be disposed between the conductive layer 160 and the conductive layer 150, so that a storage capacitance may be formed between the conductive layer 160 and the conductive layer 150. As shown in FIG. 3, the electronic device ED may further include a conductive layer 170 (referred to as a fourth conductive layer in this embodiment) disposed on the conductive layer 150, and the conductive layer 170 is electrically connected to the conductive layer 160. Specifically, an insulating layer I2 may be further disposed on the insulating layer I1 and the conductive layer 150, and the insulating layer I2 is disposed between the conductive layer 150 and the conductive layer 170, so that a storage capacitance may be formed between the conductive layer 150 and the conductive layer 170. The conductive layer 170 may be, for example, filled in a hole V6 (as shown in FIG. 3) in the insulating layer I2 and the insulating layer I1 and electrically connected to the conductive layer 160, or the conductive layer 170 may be electrically connected to the conductive layer 160 in a peripheral region of the electronic device ED (not shown). Therefore, the conductive layer 160 and the conductive layer 170 may have the same potential and serve as a common electrode CE. The conductive layer 170 may include a transparent conductive material, such as (but not limited to) indium tin oxide. In some embodiments, the conductive layer 170 may have a plurality of slit patterns; in some embodiments, the conductive layer 170 may be a whole blanket layer and be the uppermost layer of the structure shown in FIG. 3; in some embodiments, the conductive layer 170 may be a patterned conductive layer, and one pattern block of the conductive layer 170 may cover a plurality of pixels at the same time, but the present disclosure is not limited to the above.

The conductive layer 160 may include a metal material or a transparent conductive material, wherein the transparent conductive material may be, for example (but not limited to), indium tin oxide. The pattern of the conductive layer 160 may at least partially correspond to the scan line GL and/or the data line DL. According to the embodiment shown in FIG. 2 and FIG. 3, the conductive layer 160 may include a plurality of first conductive patterns 160*a* extending along the direction X and a plurality of second conductive patterns 160*b* extending along the direction Y, which are intersected with each other and arranged as a grid pattern, so that the conductive layer 160 may have a plurality of openings 160*c* to expose a portion of an aperture region (i.e., display region) of each pixel, but the present disclosure is not limited to the above. In other embodiments, the conductive layer 160 may, for example, include only a plurality of first conductive patterns 160*a* extending along the direction X or only a plurality of second conductive patterns 160*b* extending along the direction Y In the embodiment shown in FIG. 3, the first conductive pattern 160*a* (the conductive layer 160) may be at least partially overlapped with the scan line GL in the direction Z, and storage capacitances between the first conductive patterns 160*a* and the overlapped conductive layer 130 and the overlapped conductive layer 150 may be formed respectively, while the second conductive pattern 160*b* may be at least partially overlapped with the data line DL in the direction Z. When the conductive layer 160 includes opaque metal material, the conductive layer 160 exposes at least a portion of the pixel aperture region, or the conductive layer 160 is not overlapped with the pixel aperture region. For example, a size (e.g., a width) of the conductive layer 160 is less than a size of a light-shielding layer in the electronic device ED (e.g., a black matrix (not shown) or the light-shielding layer LS), or the conductive layer 160 may be made of black metal material so as to serve as a light-shielding layer at the same time. Furthermore, when the conductive layer 160 is made of metal, the design that the second conductive patterns 160*b* extending along the direction Y are connected to the conductive layer 170 may reduce the resistance of the common electrode CE and improve the voltage uniformity thereof, and the second conductive patterns 160*b* may provide a light-shielding function at the same time to reduce the probability of color mixing between adjacent pixels of different colors at oblique viewing angles. When the conductive layer 160 includes transparent conductive material, the conductive layer 160 may extend to the pixel aperture region, such as extending to the region outside the position where the hole V5 of the insulating layer I1 is located. The electronic device ED may have a higher pixel aperture ratio when the conductive layer 160 is made of transparent conductive material.

The electronic device of the present disclosure is not limited to the above embodiments. Some embodiments of the electronic devices of the present disclosure will be detailed in the following. In order to simplify the illustration, the same elements in the following would be labeled with the same symbols. The differences between different embodiments are described in detail below, and the same features would not be described redundantly.

Figure 4:
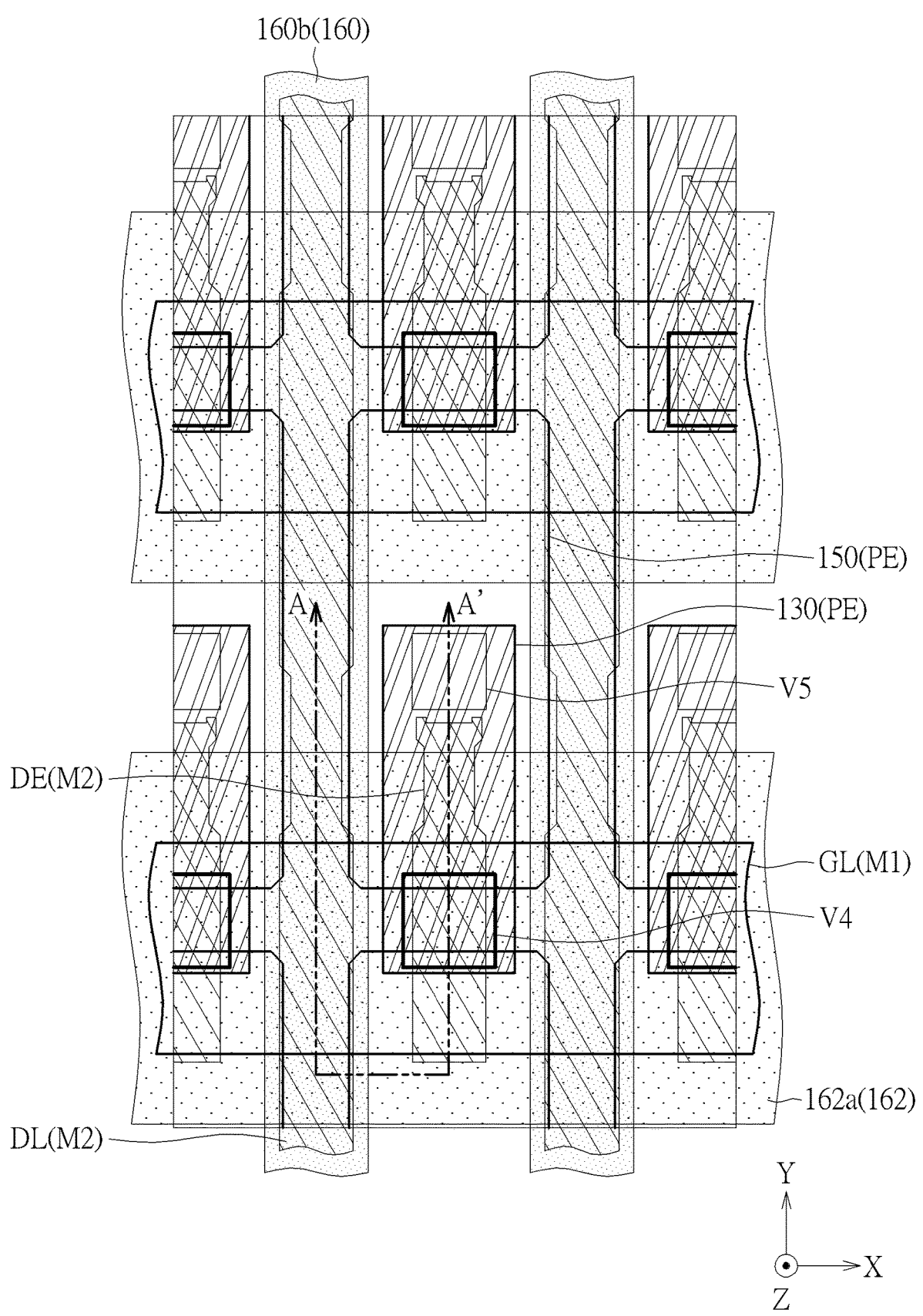
FIG. 4 is a partial top-view schematic diagram of an electronic device according to a second embodiment of the present disclosure.
Figure 5:
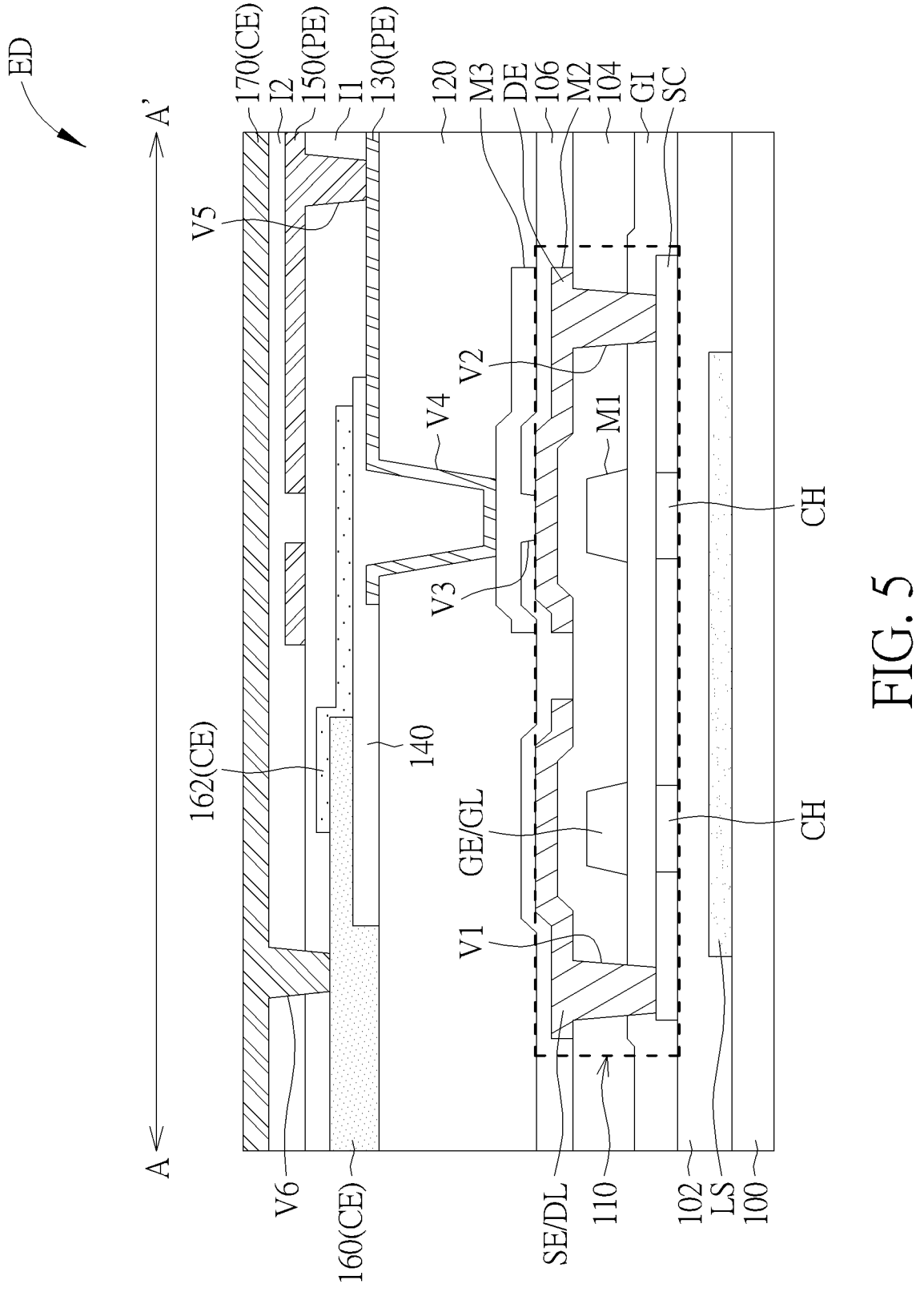
FIG. 5 is a partial cross-sectional schematic diagram of an electronic device according to a second embodiment of the present disclosure.

Please refer to FIG. 4 and FIG. 5. FIG. 4 is a partial top-view schematic diagram of an electronic device according to a second embodiment of the present disclosure. FIG. 5 is a partial cross-sectional schematic diagram of an electronic device according to a second embodiment of the present disclosure, wherein the partial cross-sectional structure of an electronic device ED corresponding to the section line A-A' in FIG. 4 may be referred to FIG. 5. The electronic device ED shown in FIG. 4 and FIG. 5 is different from the first embodiment in that the electronic device ED includes both a conductive layer 160 and a conductive layer 162, and the conductive layer 160 and the conductive layer 162 are respectively disposed between the second organic layer 140 and the conductive layer 150. According to the embodiment shown in FIG. 4 and FIG. 5, the conductive layer 160 and the conductive layer 162 may be disposed on the second organic layer 140, and the conductive layer 162 and the conductive layer 160 are in contact with and electrically connected to each other. For example, the conductive layer 162 may be partially disposed on the conductive layer 160, and the conductive layer 170 is electrically connected to the conductive layer 160 through the hole V6. Therefore, the conductive layer 160, the conductive layer 162 and the conductive layer 170 may have the same potential and serve as a common electrode CE. The material of the conductive layer 160 may be different from the material of the conductive layer 162. For example, the conductive layer 160 may include metal material and the pattern thereof may at least partially correspond to the data line DL, while the conductive layer 162 may include transparent conductive material and the pattern thereof may at least partially correspond to the scan line GL, but not limited herein. Specifically, the conductive layer 160 made of metal material may include a plurality of second conductive patterns 160*b* extending along the direction Y, the design that the second conductive patterns 160*b* are connected to the conductive layer 170 may improve the voltage uniformity of the common electrode CE, and the second conductive patterns 160*b* may be used for shielding light and reducing the probability of color mixing between pixels at oblique viewing angles. The conductive layer 162 made of transparent conductive material may include a plurality of third conductive patterns 162*a* extending along the direction X, and storage capacitances between the third conductive patterns 162*a* and the overlapped conductive layer 130 and the overlapped conductive layer 150 may be formed respectively. In the direction Y, a width of the third conductive pattern 162*a* may be greater than a width of the first conductive pattern 160*a* shown in FIG. 2, that is, the third conductive pattern 162*a* may extend to the pixel aperture region, but not limited herein. In other embodiments, the conductive layer 160 may at least partially correspond to the scan line GL, while the conductive layer 162 may include transparent conductive material and the pattern thereof may at least partially correspond to the data line DL, but not limited herein.

Figure 6:
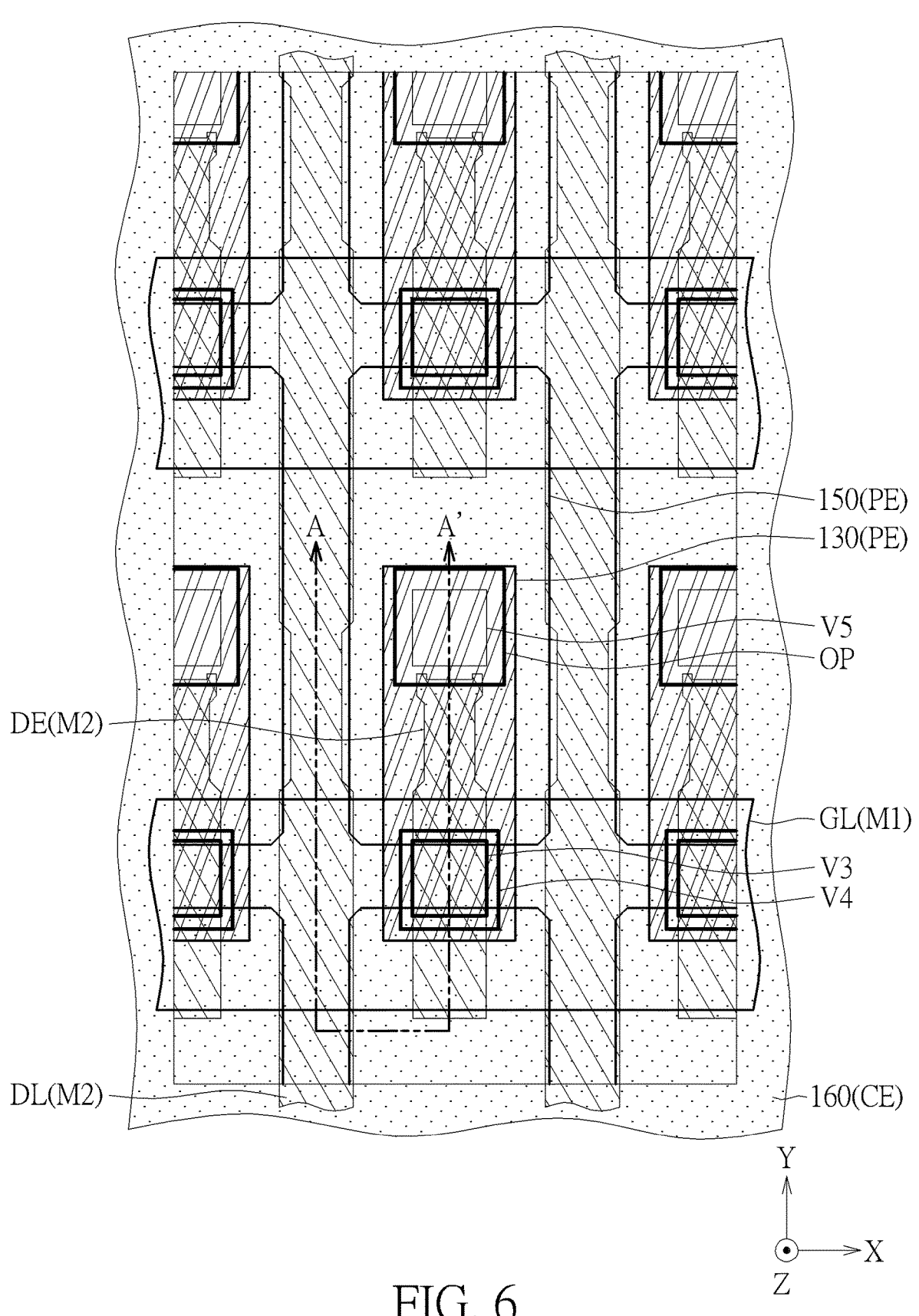
FIG. 6 is a partial top-view schematic diagram of an electronic device according to a third embodiment of the present disclosure.
Figure 7:
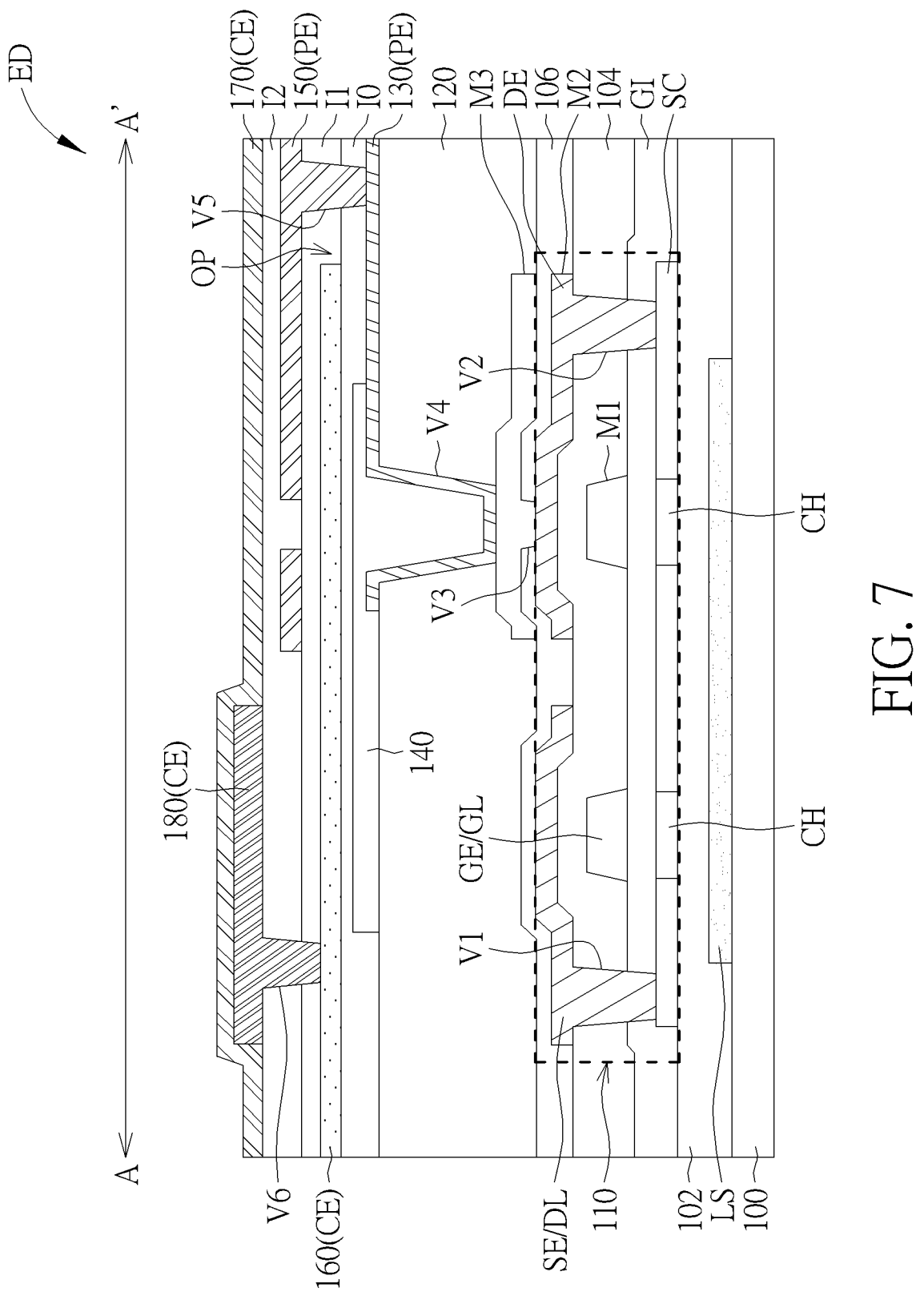
FIG. 7 is a partial cross-sectional schematic diagram of an electronic device according to a third embodiment of the present disclosure.

Please refer to FIG. 6 and FIG. 7. FIG. 6 is a partial top-view schematic diagram of an electronic device according to a third embodiment of the present disclosure. FIG. 7 is a partial cross-sectional schematic diagram of an electronic device according to a third embodiment of the present disclosure, wherein the partial cross-sectional structure of an electronic device ED corresponding to the section line A-A' in FIG. 6 may be referred to FIG. 7. The electronic device ED shown in FIG. 6 and FIG. 7 is different from the first embodiment in that the electronic device ED further includes a conductive layer 180 (referred to as a fifth conductive layer) disposed between the conductive layer 170 and the conductive layer 160, and the conductive layer 170 is electrically connected to the conductive layer 160 through the conductive layer 180, via the hole V6. In addition, the conductive layer 160 may include transparent conductive material, and the conductive layer 160 may be disposed on the second organic layer 140 as a whole surface and have a plurality of openings OP. Each of the openings OP corresponds to the hole V5. According to the embodiment shown in FIG. 6 and FIG. 7, an insulating layer I0 may be disposed on the conductive layer 130 and the second organic layer 140, and the conductive layer 160 is disposed on the insulating layer I0, so that a storage capacitance may be formed between the conductive layer 130 and the conductive layer 160. The insulating layer I1 may be disposed on the conductive layer 160, and the conductive layer 150 may be electrically connected to the conductive layer 130 through the hole V5 in the insulating layer I1 and the insulating layer I0, wherein the opening OP of the conductive layer 160 corresponds to the hole V5, so that the conductive layer 150 may be electrically connected to the conductive layer 130. Therefore, the conductive layer 130 and the conductive layer 150 may have the same potential and serve as a pixel electrode PE. The insulating layer I1 is disposed between the conductive layer 160 and the conductive layer 150, so that a storage capacitance may be formed between the conductive layer 160 and the conductive layer 150. The insulating layer I2 may be disposed on the insulating layer I1 and the conductive layer 150, the conductive layer 180 is disposed on the insulating layer I2, and the conductive layer 170 covers and contacts the conductive layer 180. The conductive layer 170 is electrically connected to the conductive layer 180, and the conductive layer 180 may be electrically connected to the conductive layer 160, for example, through the hole V6 (as shown in FIG. 7) in the insulating layer I2 and the insulating layer I1, or the conductive layer 180 may be electrically connected to the conductive layer 160 in the peripheral region of the electronic device ED (not shown). Therefore, the conductive layer 160, the conductive layer 180 and the conductive layer 170 may have the same potential and serve as a common electrode CE. The conductive layer 180 may include a metal material or a transparent conductive material. The conductive layer 180 is not shown in the top view of FIG. 6; however, the pattern and material of the conductive layer 180, and the corresponding/overlapping elements and functions thereof in this embodiment may refer to the second conductive patterns 160b and/or the first conductive patterns 160a shown in FIG. 2, the second conductive patterns 160b and/or the third conductive patterns 162a shown in FIG. 4 or the fifth conductive patterns 330b and/or the fourth conductive patterns 330a shown in FIG. 9, which will not be described redundantly herein. When both the conductive layer 160 and the conductive layer 170 are made of transparent conductive materials, the conductive layer 180 may improve the voltage uniformity of the common electrode CE and may be used for shielding light and reducing color mixing between pixels to improve the display quality if the conductive layer 180 includes metal material.

Figure 8:
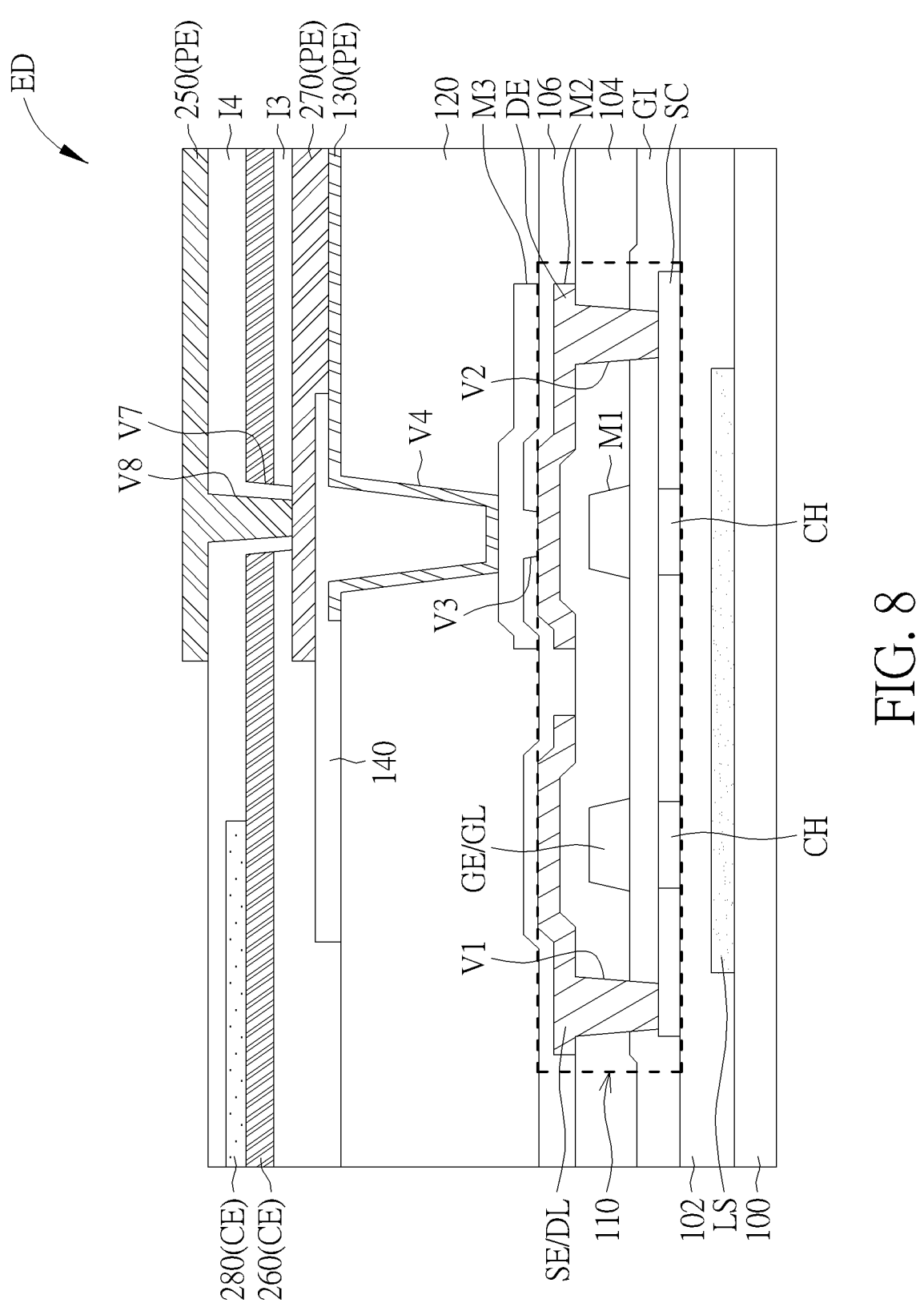
FIG. 8 is a partial cross-sectional schematic diagram of an electronic device according to a fourth embodiment of the present disclosure.

Please refer to FIG. 8, which is a partial cross-sectional schematic diagram of an electronic device according to a fourth embodiment of the present disclosure. According to the embodiment shown in FIG. 8, an electronic device ED may include a substrate 100, a thin film transistor 110, a first organic layer 120, a conductive layer 130 (referred to as a first conductive layer in this embodiment), a second organic layer 140, a conductive layer 250 (referred to as a second conductive layer) and a conductive layer 260 (referred to as a third conductive layer). The thin film transistor 110 is disposed on the substrate 100. The first organic layer 120 is disposed on the thin film transistor 110 and has a hole V4, and the conductive layer 130 is disposed on the first organic layer 120 and electrically connected to the thin film transistor 110 through the hole V4. The elements and layers between the substrate 100 and the first organic layer 120 and the detailed structure of the thin film transistor 110 may be referred to the previous embodiments, which will not be described redundantly herein. As shown in FIG. 8, the second organic layer 140 is disposed on the first organic layer 120 and the conductive layer 130 and at least partially disposed in the hole V4. The conductive layer 250 is disposed on the second organic layer 140 and electrically connected to the conductive layer 130. The conductive layer 260 is disposed between the second organic layer 140 and the conductive layer 250. Specifically, the second organic layer 140 may cover a portion of the conductive layer 130, so that the portion of the conductive layer 130 may be disposed between the first organic layer 120 and the second organic layer 140. Another portion of the conductive layer 130 may not be covered by the second organic layer 140, and a conductive layer 270 may be disposed on the second organic layer 140 and the conductive layer 130. The conductive layer 270 covers and contacts a portion of the surface of the conductive layer 130, so that the conductive layer 270 may be electrically connected to the exposed portion of the conductive layer 130 that is not covered by the second organic layer 140 without passing through holes. An insulating layer I3 may be disposed on the conductive layer 270, and the conductive layer 260 is disposed on the insulating layer I3. An insulating layer I4 may be disposed on the conductive layer 260, and the conductive layer 250 is disposed on the insulating layer I4. The insulating layer I4 may be at least partially disposed in a hole V7 in the insulating layer I3 and the conductive layer 260, and the insulating layer I4 has a hole V8 corresponding to the hole V7. For example, the hole V8 may be overlapped with the hole V7 in the direction Z and surrounded by the hole V7 in the cross-sectional view, that is, the hole V8 is located within the hole V7. The conductive layer 250 may be electrically connected to the conductive layer 270 through the hole V8 in the insulating layer I4, and the conductive layer 250 is electrically isolated from the conductive layer 260. Therefore, the conductive layer 130, the conductive layer 270 and the conductive layer 250 may have the same potential and serve as a pixel electrode PE. The conductive layer 130, the conductive layer 270 and the conductive layer 250 may include transparent conductive materials, such as (but not limited to) indium tin oxide. According to the above structure, the insulating layer I3 is disposed between the conductive layer 270 and the conductive layer 260, so that a storage capacitance may be formed between the conductive layer 270 and the conductive layer 260. The insulating layer I4 is disposed between the conductive layer 260 and the conductive layer 250, so that a storage capacitance may be formed between the conductive layer 260 and the conductive layer 250.

As shown in FIG. 8, the electronic device ED may further include a conductive layer 280, which may be disposed on the upper surface of the conductive layer 260 (as shown in FIG. 8) or the lower surface of the conductive layer 260 and contact the conductive layer 260. In the embodiment shown in FIG. 8, the conductive layer 280 covers a portion of the surface of the conductive layer 260, so that the conductive layer 280 may be electrically connected to the conductive layer 260 without passing through holes, and the conductive layer 280 is electrically isolated from the conductive layer 250. Therefore, the conductive layer 260 and the conductive layer 280 may have the same potential and serve as a common electrode CE. The conductive layer 260 may include transparent conductive material, such as (but not limited to) indium tin oxide. In the embodiment shown in FIG. 8, the conductive layer 280 may include metal material, but not limited herein. The conductive layer 280 may include transparent conductive material in other embodiments. The pattern and material of the conductive layer 280, and the corresponding/overlapping elements and functions thereof may refer to the second conductive patterns 160*b* and/or the first conductive patterns 160*a* shown in FIG. 2, the second conductive patterns 160*b* and/or the third conductive patterns 162*a* shown in FIG. 4 or the fifth conductive patterns 330*b* and/or the fourth conductive patterns 330*a* shown in FIG. 9, which will not be described redundantly herein.

Figure 9:
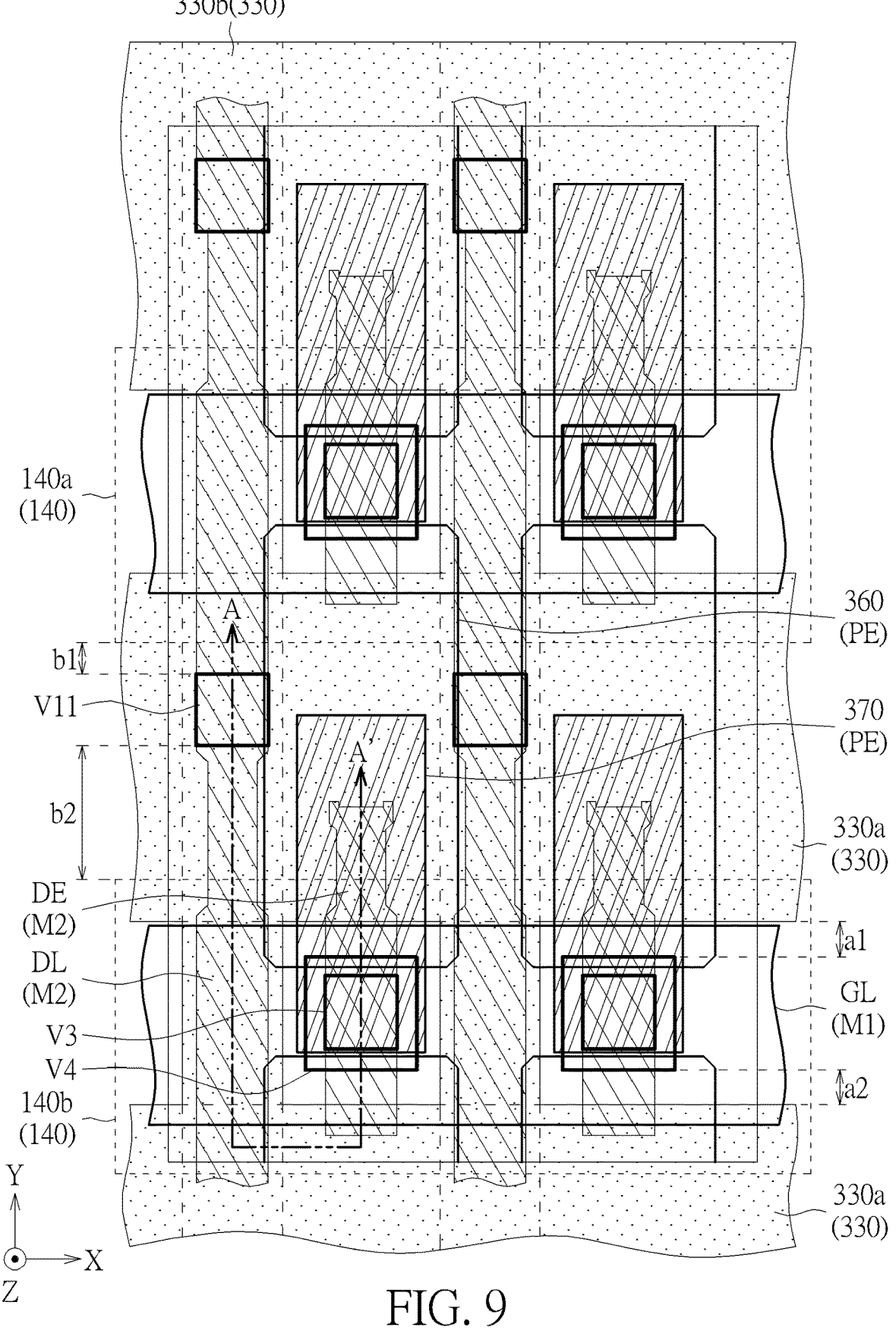
FIG. 9 is a partial top-view schematic diagram of an electronic device according to a fifth embodiment of the present disclosure.
Figure 10:
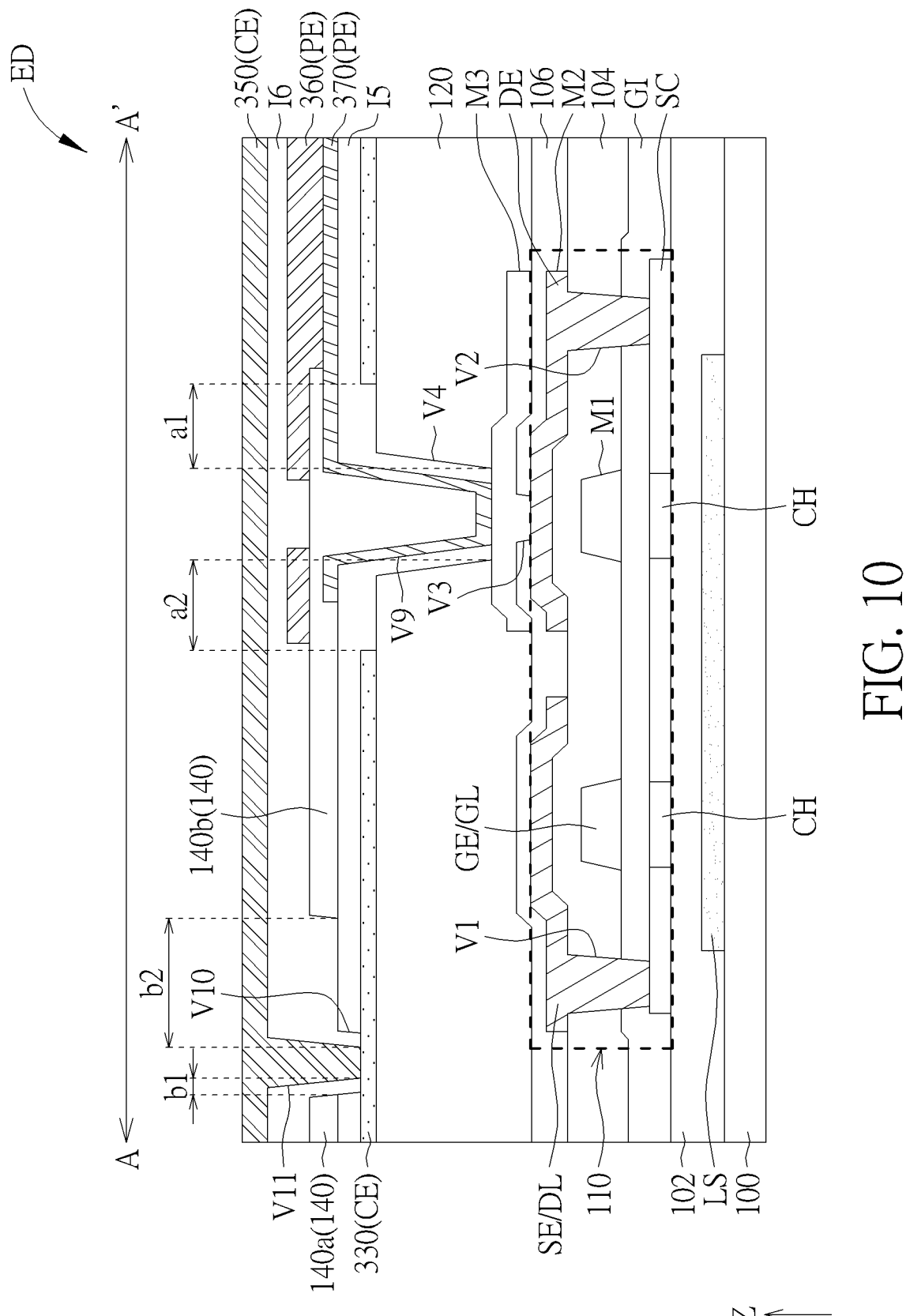
FIG. 10 is a partial cross-sectional schematic diagram of an electronic device according to a fifth embodiment of the present disclosure.

Please refer to FIG. 9 and FIG. 10. FIG. 9 is a partial top-view schematic diagram of an electronic device according to a fifth embodiment of the present disclosure. FIG. 10 is a partial cross-sectional schematic diagram of an electronic device according to a fifth embodiment of the present disclosure, wherein the partial cross-sectional structure of an electronic device ED corresponding to the section line A-A' in FIG. 9 may be referred to FIG. 10. According to the embodiment shown in FIG. 9 and FIG. 10, an electronic device ED may include a substrate 100, a thin film transistor 110, a first organic layer 120, a conductive layer 330 (referred to as a first conductive layer in this embodiment), a second organic layer 140, a conductive layer 350 (referred to as a second conductive layer) and a conductive layer 360 (referred to as a third conductive layer). The thin film transistor 110 is disposed on the substrate 100 and includes a drain DE, and the first organic layer 120 is disposed on the thin film transistor 110 and has a hole V4. The elements and layers between the substrate 100 and the first organic layer 120 and the detailed structure of the thin film transistor 110 may be referred to the previous embodiments, which will not be described redundantly herein. As shown in FIG. 9 and FIG. 10, the conductive layer 330 is disposed on the first organic layer 120. The second organic layer 140 is disposed on the first organic layer 120 and the conductive layer 330 and at least partially disposed in the hole V4. The conductive layer 350 is disposed on the second organic layer 140 and electrically connected to the conductive layer 330. The conductive layer 360 is disposed between the second organic layer 140 and the conductive layer 350, and the conductive layer 360 is electrically connected to the drain DE of the thin film transistor 110. Specifically, an insulating layer I5 may be disposed on the conductive layer 330. The insulating layer I5 may be at least partially disposed in the hole V4 of the first organic layer 120, and the insulating layer I5 has a hole V9 corresponding to the hole V4. For example, the hole V9 may be overlapped with the hole V4 in the direction Z and surrounded by the hole V4 in the cross-sectional view, that is, the hole V9 is located within the hole V4, but not limited herein. The hole V4 may be surrounded by the hole V9, so that the hole V4 is located within the hole V9 in other embodiments. A conductive layer 370 may be disposed on the insulating layer I5. The conductive layer 370 may be electrically connected to the drain DE of the thin film transistor 110 through the hole V9 in the insulating layer I5, and the conductive layer 370 is electrically isolated from the conductive layer 330. The second organic layer 140 may be disposed on and cover a portion of the conductive layer 370, so that the portion of the conductive layer 370 may be disposed between the first organic layer 120 and the second organic layer 140. Another portion of the conductive layer 370 may not be covered by the second organic layer 140, and the conductive layer 360 is disposed on the second organic layer 140 and the conductive layer 370. The conductive layer 360 covers and directly contacts a portion of the surface of the conductive layer 370, so that the conductive layer 360 may be electrically connected to the exposed portion of the conductive layer 370 without passing through holes. Therefore, the conductive layer 370 and the conductive layer 360 may have the same potential and serve as a pixel electrode PE. For example, the conductive layer 370 may include transparent conductive material, and the conductive layer 360 may include transparent conductive material, such as (but not limited to) indium tin oxide. An insulating layer I6 may be disposed on the conductive layer 360 and the second organic layer 140, and the conductive layer 350 is disposed on the insulating layer I6. The insulating layer I6 may be at least partially disposed in a hole V10 in the insulating layer I5 and the second organic layer 140, and the insulating layer I6 has a hole V11 corresponding to the hole V10. For example, the hole V11 may be overlapped with the hole V10 in the direction Z and surrounded by the hole V10 in the cross-sectional view, that is, the hole V11 is located within the hole V10, but not limited herein. The hole V10 may be surrounded by the hole V11, so that the hole V10 is located within the hole V11 in other embodiments. The conductive layer 350 may be electrically connected to the conductive layer 330 through the hole V11 in the insulating layer I6, and the conductive layer 350 is electrically isolated from the conductive layer 360. Therefore, the conductive layer 330 and the conductive layer 350 may have the same potential and serve as a common electrode CE. The conductive layer 350 may include transparent conductive material, such as (but not limited to) indium tin oxide. According to the above structure, the insulating layer I5 is disposed between the conductive layer 330 and the conductive layer 360, so that a storage capacitance may be formed between the conductive layer 330 and the conductive layer 360. The insulating layer I6 is disposed between the conductive layer 360 and the conductive layer 350, so that a storage capacitance may be formed between the conductive layer 360 and the conductive layer 350. The conductive layer 330 may include transparent conductive material, wherein the transparent conductive material is, for example (but not limited to), indium tin oxide. In some embodiments, the conductive layer 330, the conductive layer 350 and the conductive layer 360 may include transparent conductive materials, so that the pixel aperture ratio may not be affected even if these conductive layers cover the pixel aperture region, and the pixel region may be utilized more effectively to form the storage capacitance, thereby increasing the overall capacitance.

According to the embodiment shown in FIG. 9 and FIG. 10, the conductive layer 330 may include a plurality of fourth conductive patterns 330*a* extending along the direction X and a plurality of fifth conductive patterns 330*b* extending along the direction Y, but the present disclosure is not limited to the above. The conductive layer 330 may include only the fourth conductive patterns 330*a* extending along the direction X or only the fifth conductive patterns 330*b* extending along the direction Y in other embodiments, for example. Storage capacitances may be formed between the fourth conductive patterns 330*a* and the overlapped conductive layer 360 respectively, while the fifth conductive pattern 330*b* may at least partially correspond to and be at least partially overlapped with the data line DL in the direction Z, and the fifth conductive pattern 330*b* may contact the conductive layer 350 through the hole V10 and the hole V11. The conductive layer 330 made of transparent conductive material may extend to the pixel aperture region and make the electronic device ED have a higher pixel aperture ratio. For example, the conductive layer 330 may extend to the region outside the position where the hole V4 in the first organic layer 120 is located.

As shown in FIG. 9 and FIG. 10, in some embodiments, a first distance may exist between an edge of the hole V4 of the first organic layer 120 and an end of the conductive layer 330, wherein the first distance may be greater than or equal to 0.1 micrometers (μm) and less than or equal to 5 micrometers, so that the probability of short circuit caused between the conductive layer 330 and the conductive layer 370 may be reduced. For example, the shortest distance between an edge of a lower portion of the hole V4 closest to the drain DE and an adjacent end of the conductive layer 330 (e.g., an edge of one of the fourth conductive patterns 330a) may be a first distance a1, and the shortest distance between an edge of a lower portion of the hole V4 closest to the drain DE and another adjacent end of the conductive layer 330 (e.g., an edge of another one of the fourth conductive patterns 330a) may be a first distance a2, wherein the first distance a1 and the first distance a2 may be greater than or equal to 0.1 micrometers and less than or equal to 5 micrometers respectively, but not limited herein. In some embodiments, the pattern of the second organic layer 140 may, for example (but not limited to), at least partially correspond to the scan line GL, and a second distance may exist between an end of the second organic layer 140 and an edge of the hole V11 of the insulating layer I6, wherein the second distance may be greater than or equal to 0.1 micrometers and less than or equal to 20 micrometers, so as to facilitate the conductive layer 350 to be electrically connected to the conductive layer 330 through the hole V11. For example, the shortest distance between an edge of a lower portion of the hole V11 closest to the conductive layer 330 and an adjacent end of the second organic layer 140 (e.g., an edge of one pattern 140a of the second organic layer 140) may be a second distance b1, and the shortest distance between an edge of a lower portion of the hole V11 closest to the conductive layer 330 and another adjacent end of the of the second organic layer 140 (e.g., an edge of another pattern 140b of the second organic layer 140) may be a second distance b2, wherein the second distance b1 and the second distance b2 may be greater than or equal to 0.1 micrometers and less than or equal to 20 micrometers respectively, but not limited herein.

Figure 11:
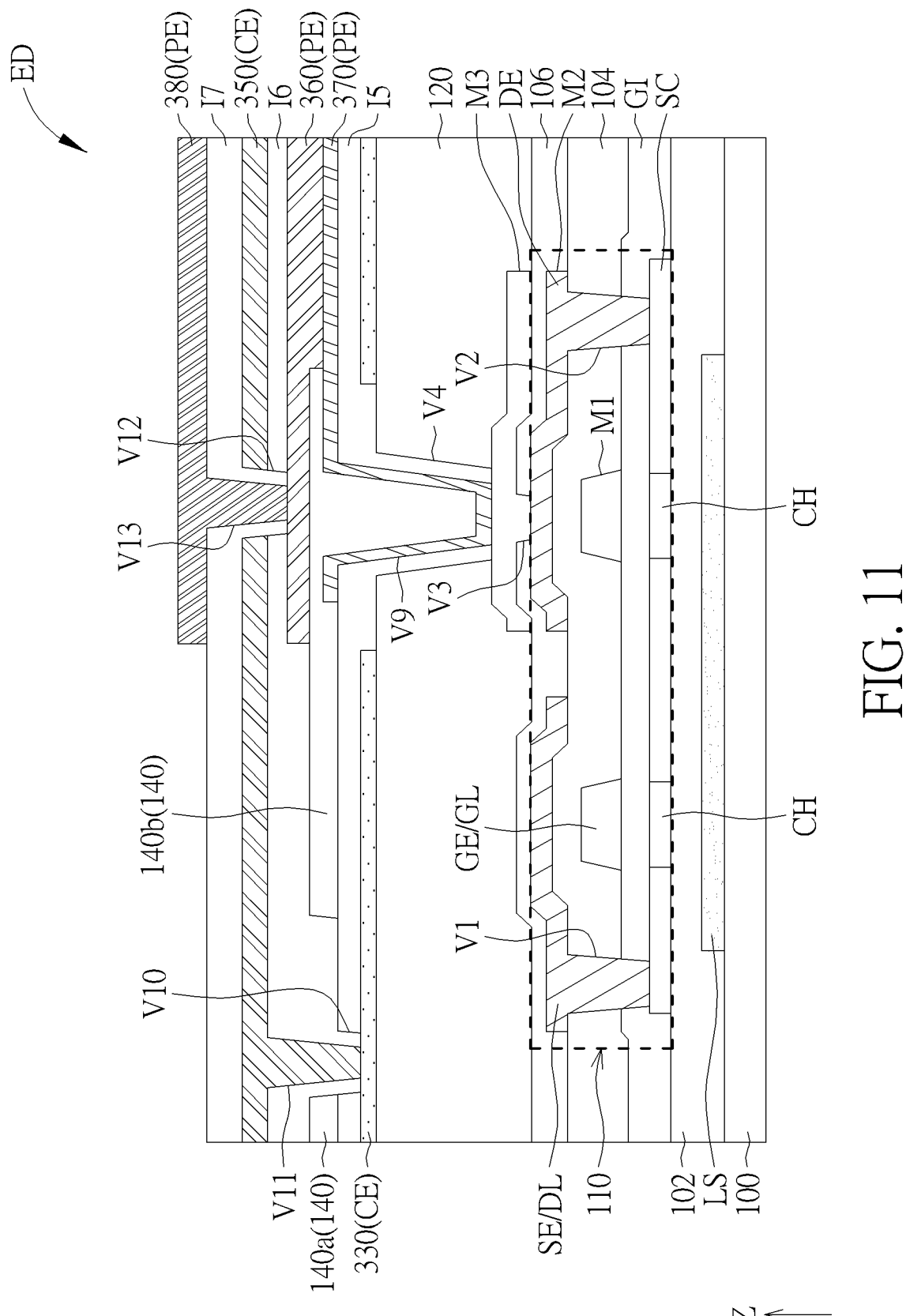
FIG. 11 is a partial cross-sectional schematic diagram of an electronic device according to a sixth embodiment of the present disclosure.

Please refer to FIG. 11, which is a partial cross-sectional schematic diagram of an electronic device according to a sixth embodiment of the present disclosure. An electronic device ED shown in FIG. 11 is different from the fifth embodiment in that the electronic device ED may further include a conductive layer 380 (referred to as a fourth conductive layer) disposed on the conductive layer 350, and the conductive layer 380 is electrically connected to the conductive layer 360. According to the embodiments shown in FIG. 11, an insulating layer I7 may be disposed on the conductive layer 350, and the conductive layer 380 is disposed on the insulating layer I7. The insulating layer I7 may be at least partially disposed in a hole V12 in the insulating layer I6 and the conductive layer 350, and the insulating layer I7 has a hole V13 corresponding to the hole V12. For example, the hole V13 may be overlapped with the hole V12 in the direction Z and surrounded by the hole V12 in the cross-sectional view, that is, the hole V13 is located within the hole V12. The conductive layer 380 may be electrically connected to the conductive layer 360 through the hole V13 in the insulating layer I7, and the conductive layer 380 is electrically isolated from the conductive layer 350. Therefore, the conductive layer 370, the conductive layer 360 and the conductive layer 380 may have the same potential and serve as a pixel electrode PE. The conductive layer 380 may include transparent conductive material, such as (but not limited to) indium tin oxide. According to the above structure, the insulating layer I7 is disposed between the conductive layer 350 and the conductive layer 380, so that a storage capacitance may be formed between the conductive layer 350 and the conductive layer 380.

From the above description, according to the electronic devices of the embodiments of the present disclosure, according to the structural design of conductive layers and organic layers, storage capacitances may exist between different conductive layers, so that the storage capacitance may be increased, thereby improving the display quality. In some embodiments, the common electrode may be formed of multiple conductive layers, and the pixel electrode may be formed of multiple conductive layers, wherein the conductive layers of the common electrode and the pixel electrode may be disposed alternately, and an insulating layer is disposed between the upper conductive layer and the lower conductive layer which are adjacent to each other, so that the storage capacitance may be increased in a limited pixel region space. Therefore, by disposing the patterned conductive layers, accompanied with the material selection, the storage capacitance may be increased, the voltage uniformity of the electrode may be improved, and/or the light-shielding function may be provided, thereby improving the display quality of the electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a substrate;
a thin film transistor disposed on the substrate;
a first organic layer disposed on the thin film transistor and having a hole;
a first conductive layer disposed on the first organic layer, wherein the first conductive layer is electrically connected to the thin film transistor through the hole;
a second organic layer disposed on the first organic layer and the first conductive layer, wherein the second organic layer is at least partially disposed in the hole;
a second conductive layer disposed on the second organic layer and electrically connected to the first conductive layer;
a third conductive layer disposed between the second organic layer and the second conductive layer; and
a plurality of scan lines and a plurality of data lines disposed on the substrate, wherein the plurality of scan lines extend along a first direction, the plurality of data lines extend along a second direction, and the first direction is not parallel to the second direction,
wherein the third conductive layer comprises a plurality of first conductive patterns extending along the first direction and a plurality of second conductive patterns extending along the second direction, and the plurality of first conductive patterns intersect the plurality of second conductive patterns to form a grid pattern.

2. The electronic device according to claim 1, wherein the thin film transistor comprises a drain, and the first conductive layer is electrically connected to the drain.

3. The electronic device according to claim 2, wherein the first conductive layer and the second conductive layer comprise a transparent conductive material respectively.

4. The electronic device according to claim 2, wherein the third conductive layer comprises a metal material or a transparent conductive material.

5. The electronic device according to claim 2, further comprising a fourth conductive layer disposed on the second conductive layer, wherein the fourth conductive layer is electrically connected to the third conductive layer.

6. The electronic device according to claim 5, further comprising a fifth conductive layer disposed between the fourth conductive layer and the third conductive layer, wherein the fourth conductive layer is electrically connected to the third conductive layer through the fifth conductive layer.

7. The electronic device according to claim 6, wherein the fifth conductive layer comprises a metal material or a transparent conductive material.

8. The electronic device according to claim 1, further comprising a light-shielding layer disposed on the substrate and at least partially overlapped with one of the scan lines in a normal direction of the electronic device, wherein in the second direction, a width of the light-shielding layer is greater than a width of the one of the scan lines.

9. The electronic device according to claim 1, wherein in a normal direction of the electronic device, each of the first conductive patterns is at overlapped with a respective one of the scan lines, and each of the second conductive patterns is overlapped with a respective one of the data lines.

10. An electronic device, comprising:
a substrate;
a thin film transistor disposed on the substrate and comprising a drain;
a first organic layer disposed on the thin film transistor and having a hole;
a first conductive layer disposed on the first organic layer;
a second organic layer disposed on the first organic layer and the first conductive layer, wherein the second organic layer is at least partially disposed in the hole;
a second conductive layer disposed on the second organic layer and electrically connected to the first conductive layer;
a third conductive layer disposed between the second organic layer and the second conductive layer, wherein the third conductive layer is electrically connected to the drain; and
a plurality of scan lines and a plurality of data lines disposed on the substrate, wherein the plurality of scan lines extend along a first direction, the plurality of data lines extend along a second direction, and the first direction is not parallel to the second direction,
wherein the first conductive layer comprises a plurality of fourth conductive patterns extending along the first direction and a plurality of fifth conductive patterns extending along the second direction, and the plurality of fourth conductive patterns intersect the plurality of fifth conductive patterns to form a grid pattern.

11. The electronic device according to claim 10, wherein the third conductive layer comprises a transparent conductive material.

12. The electronic device according to claim 10, further comprising a fourth conductive layer disposed on the second conductive layer, wherein the fourth conductive layer is electrically connected to the third conductive layer.

13. The electronic device according to claim 10, wherein a first distance exists between an edge of the hole of the first organic layer and an end of the first conductive layer, and the first distance is greater than or equal to 0.1 micrometers and less than or equal to 5 micrometers.

14. The electronic device according to claim 10, further comprising an insulating layer disposed between the third conductive layer and the second conductive layer, wherein the insulating layer has a hole, and the second conductive layer is electrically connected to the first conductive layer through the hole of the insulating layer.

15. The electronic device according to claim 14, wherein a second distance exists between an end of the second organic layer and an edge of the hole of the insulating layer, and the second distance is greater than or equal to 0.1 micrometers and less than or equal to 20 micrometers.

16. An electronic device, comprising:
a substrate;
a thin film transistor disposed on the substrate;
a first organic layer disposed on the thin film transistor and having a hole;
a first conductive layer disposed on the first organic layer, wherein the first conductive layer is electrically connected to the thin film transistor through the hole;
a second organic layer disposed on the first organic layer and the first conductive layer, wherein the second organic layer is at least partially disposed in the hole;
a second conductive layer disposed on the second organic layer and electrically connected to the first conductive layer;
a third conductive layer disposed between the second organic layer and the second conductive layer;
a fourth conductive layer disposed on the second organic layer, wherein the fourth conductive layer is in contact with and electrically connected to the third conductive layer; and
a plurality of scan lines and a plurality of data lines disposed on the substrate, wherein the plurality of scan lines extend along a first direction, the plurality of data lines extend along a second direction, and the first direction is not parallel to the second direction,
wherein the third conductive layer comprises a plurality of second conductive patterns extending along the second direction, the fourth conductive layer comprises a plurality of third conductive patterns extending along the first direction, and the plurality of second conductive patterns intersect the plurality of third conductive patterns to form a grid pattern.

17. The electronic device according to claim 16, wherein in a normal direction of the electronic device, each of the second conductive patterns is overlapped with a respective one of the data lines, and each of the third conductive patterns is overlapped with a respective one of the scan lines.

18. The electronic device according to claim 16, wherein the third conductive layer comprises a metal material, and the fourth conductive layer comprises a transparent conductive material.

* * * * *